United States Patent
Beck et al.

(10) Patent No.: US 9,595,962 B1
(45) Date of Patent: Mar. 14, 2017

(54) METHOD TO IMPLEMENT A SHORT PIN DETECTOR ON A BUS BAR

(71) Applicant: Google Inc., Mountain View, CA (US)

(72) Inventors: Jonathan David Beck, Mountain View, CA (US); Jeffrey Scott Spaulding, Sunnyvale, CA (US); Debosmita Das, Sunnyvale, CA (US)

(73) Assignee: Google Inc., Mountain View, CA (US)

( * ) Notice: Subject to any disclaimer, the term of this patent is extended or adjusted under 35 U.S.C. 154(b) by 580 days.

(21) Appl. No.: 14/142,016

(22) Filed: Dec. 27, 2013

(51) Int. Cl.
*H01H 35/00* (2006.01)
*H03K 17/965* (2006.01)

(52) U.S. Cl.
CPC ........... *H03K 17/965* (2013.01); *H01H 35/00* (2013.01)

(58) Field of Classification Search
CPC .............................. H03K 17/965; H01H 35/00
USPC .................................... 439/251, 924.1, 924.2
See application file for complete search history.

(56) References Cited

U.S. PATENT DOCUMENTS

| | | | |
|---|---|---|---|
| 3,521,332 A | 7/1970 | Kramer | |
| 4,013,329 A | 3/1977 | Hugin | |
| 4,553,799 A | 11/1985 | Deters | |
| 4,775,338 A | 10/1988 | Norden | |
| 5,160,285 A | 11/1992 | Murray | |
| 5,421,751 A | 6/1995 | Bennett et al. | |
| 5,431,576 A | 7/1995 | Matthews | |
| 5,980,311 A | 11/1999 | Campbell et al. | |
| 6,089,929 A | 7/2000 | Sloey | |
| 6,402,525 B2 | 6/2002 | Gugliotti et al. | |
| 6,561,844 B1 | 5/2003 | Johnson | |
| 6,773,314 B2 | 8/2004 | Mills et al. | |
| 7,011,548 B2 | 3/2006 | Bogiel et al. | |
| 7,014,516 B2 | 3/2006 | Yang | |
| 7,062,886 B2 | 6/2006 | Auriemma | |
| 7,581,972 B2 | 9/2009 | Daamen | |
| 7,766,706 B2 | 8/2010 | Kawamura et al. | |
| D632,260 S | 2/2011 | Smith | |
| 7,997,910 B2 | 8/2011 | Myers et al. | |
| 8,182,299 B2 | 5/2012 | Schrader | |

(Continued)

OTHER PUBLICATIONS

"Crown Clip Junior Direct Power Connection for Bus Bars." Tyco Electronics, Ltd. Catalog 1654261-8, Issued Sep. 2008. [Retrieved Nov. 8, 2013]. Retrieved from the Internet: <www.te.com/catalog/Presentations/CrownClipJrPresentation.pdf>, 8 pages.

(Continued)

*Primary Examiner* — Hal Kaplan
(74) *Attorney, Agent, or Firm* — Lerner, David, Littenberg, Krumholz & Mentlik, LLP

(57) ABSTRACT

The present disclosure provides a method of safely activating and deactivating hot-swap circuitry powered off of a bus bar. One aspect of the present technology provides a method that includes receiving a bus bar connector. The bus bar connector includes a housing having first and second electrical contacts. The first and second electrical contacts are configured to connect with a bus bar. The bus bar connector also includes a short pin detector attached to the housing. The short pin detector is configured to transmit one or more signals. The method includes engaging the first and second electrical contacts with the bus bar. In response to engaging of the first and second electrical contacts, a first signal can be transmitted indicating that the housing is connected to the bus bar and a hot-swap payload associated with the bus bar connector is activated.

20 Claims, 4 Drawing Sheets

(56) References Cited

U.S. PATENT DOCUMENTS

| | | |
|---|---|---|
| 8,388,389 B2 | 3/2013 | Costello et al. |
| 8,881,481 B2 | 11/2014 | Myers et al. |
| 2007/0057130 A1 | 3/2007 | Nikayin et al. |
| 2010/0050561 A1 | 3/2010 | Jafari |

OTHER PUBLICATIONS

"Power Connectors & Interconnection Systems." Tyco Electronics, Ltd. Catalog 1773096, Revised Feb. 2010. [Retrieved Nov. 8, 2013]. Retrieved from the Internet: <http://www.te.com/commerce/DocumentDelivery/DDEController?Action=srchrtrv&DocNm=1773096_FULL_POWER_CATALOG&DocType=CS&DocLang=EN>, 11 pages.

"Quick Reference Guide Bus Bar Connectivity." Tyco Electronics Corporation, a TE Connectivity Ltd. company. © 2013. [Retrieved Nov. 8, 2013]. Retrieved from the Internet: <www.te.com/products/busbar>, 6 pages.

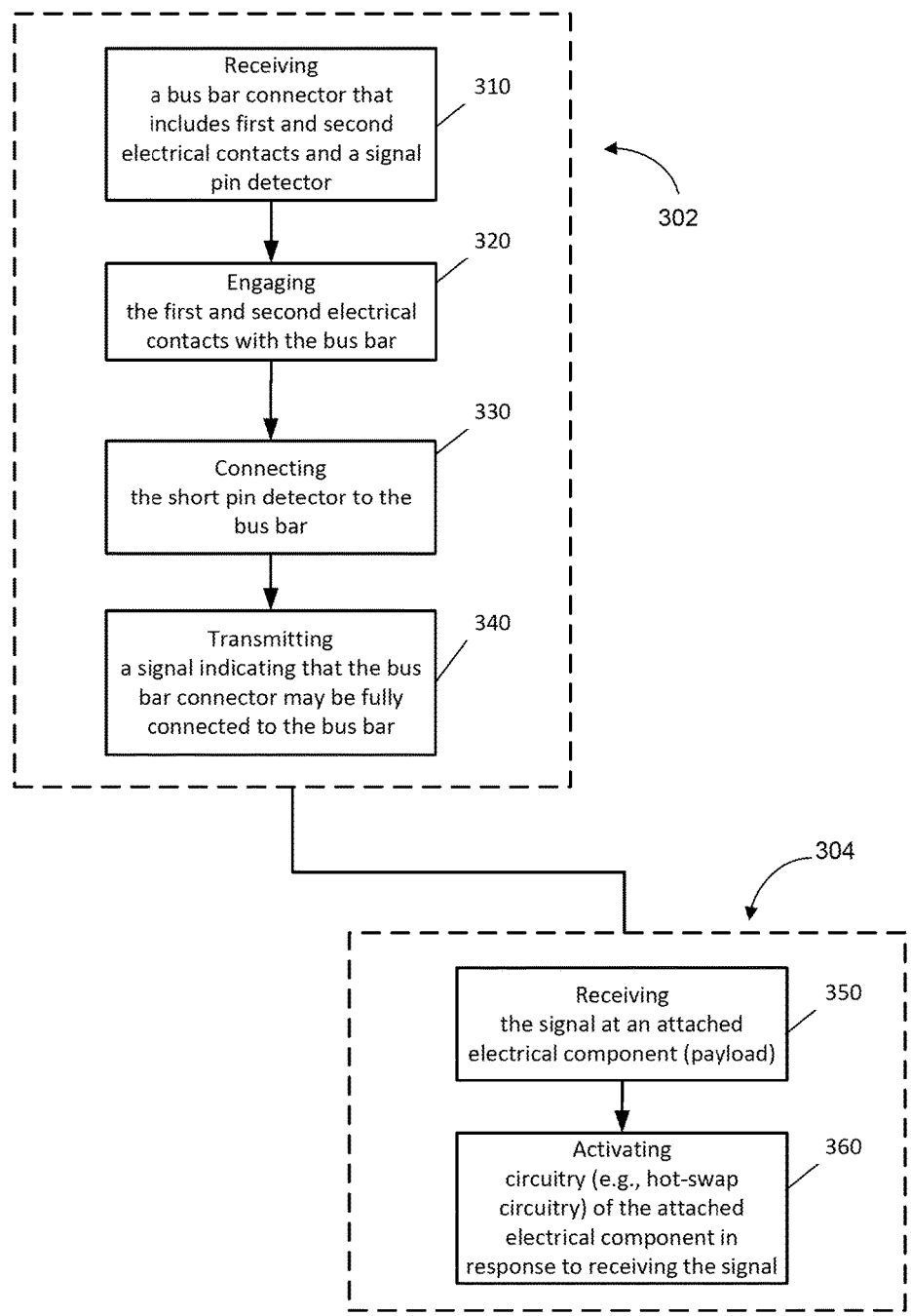

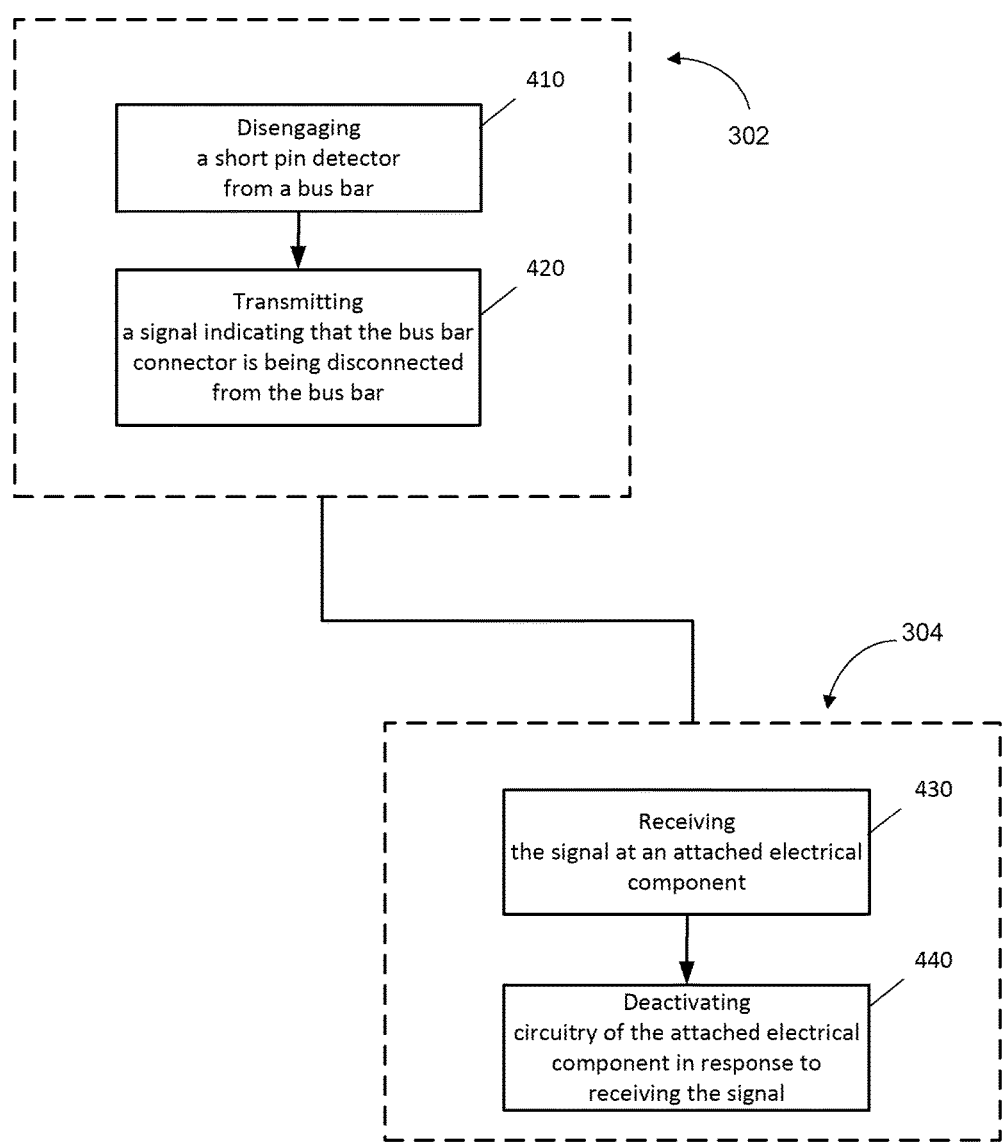

METHOD TO IMPLEMENT A SHORT PIN DETECTOR ON A BUS BAR

BACKGROUND

In electrical power distribution, bus bars are designed to distribute electricity to hardware components connected to an apparatus, such as a distribution board, switchboard, and substation. Many of these hardware components (e.g., servers, disk arrays and network switches) include how-swap circuitry which allows the components to be replaced without requiring a shut down. For example, hot-swapping may be used to replace faulty system components without shutting down or significantly interrupting a system's operations. Typically, these hot-swap components may automatically activate when connected to a bus bar. However, activation of the components before they are completely attached to the bus bar can possibly damage the components as well as the systems they serve.

BRIEF SUMMARY OF THE INVENTION

Aspects of the disclosure are advantageous for providing a method of safely activating and deactivating hot-swap circuitry powered off of a bus bar. One aspect of the present technology provides a method that includes receiving a bus bar connector. The bus bar connector includes a housing having first and second electrical contacts. The first and second electrical contacts are configured to connect to a bus bar. The bus bar connector also includes a short pin detector attached to the housing. The short pin detector can be configured to transmit one or more signals. The method includes engaging the first and second electrical contacts with the bus bar. In response to engaging the first and second electrical contacts, a first signal can be transmitted indicating that the housing is connected to the bus bar and a hot-swap payload associated with the bus bar connector is activated.

In one example, the short pin detector includes components for generating the one or more signals.

In one example, the short pin detector includes a short pin and a fastener to secure the short pin to the housing. In this example, transmitting includes engaging the short pin with the bus bar.

In another example, the first signal may be received at an electrical component. The electrical component may be attached to the housing. In response to receiving the first signal, circuitry of the electrical component can be activated. In this regard, after transmitting the first signal, a flow of electrical current from the bus bar through the housing may be initiated.

In yet another example, the short pin may be disengaged from the bus bar. A second signal may be transmitted indicating that the housing can be disconnected from the bus bar. Here, the second signal can be received at an electrical component. The electrical component may be attached to the housing. In response to receiving the second signal, circuitry of the electrical component can be deactivated.

Another aspect of the present technology provides a system that includes a bus bar for supplying current from a power supply to a device and a bus bar connector. The bus bar connector includes a housing having first and second electrical contacts. The first and second electrical contacts are configured to connect to the bus bar. A short pin detector may be attached to the housing. The short pin detector can be configured to transmit one or more signals, where at least one of the one or more signals indicates that the housing may be connected to the bus bar.

Yet another aspect of the present technology provides an apparatus that includes a housing having first and second electrical contacts. The first and second electrical contacts are configured to connect to a bus bar. A short pin detector is attached to the housing. The short pin detector can be configured to transmit one or more signals, where at least one of the one or more signals indicates that the housing may be connected to the bus bar.

BRIEF DESCRIPTION OF THE DRAWINGS

FIG. 3 is a flow diagram of an example system operation in accordance with aspects of the disclosure.

FIG. 4 is another flow diagram of an example system operation in accordance with aspects of the disclosure.

DETAILED DESCRIPTION

Aspects, features and advantages of the disclosure will be appreciated when considered with reference to the following description of embodiments and accompanying figures. The same reference numbers in different drawings may identify the same or similar elements. Furthermore, the following description is not limiting; the scope of the present technology is defined by the appended claims and equivalents. While certain processes in accordance with example embodiments are shown in the figures as occurring in a linear fashion, this is not a requirement unless expressly stated herein. Different processes may be performed in a different order or concurrently. Steps may also be added or omitted unless otherwise stated.

The subject matter of the present disclosure generally relates to a method of powering a payload (e.g., an electronic device) off of a bus bar so as to safely activate and deactivate the payload's hot-swap circuitry. By incorporating a mechanism within a bus bar connector to detect when the connector has firmly engaged the bus bar, the mechanism can be used to signal a connected payload that it can safely power on. For example, the mechanism may include a "short pin" that can tap into a power supply rail of the bus bar.

During a mating cycle of the bus bar connector to the bus bar, a main power and return connector engage first, and then the short pin engages the bus bar at a slightly later time period. Using the short pin in this manner will keep the payloads from activating until the power and return rails of the bus bar are completely connected. Conversely, the short pin will be the first connection to disengage during a de-mating cycle. This allows a payload an amount of time to power down before the bus bar connector fully disengages. An example of a bus bar connector that includes a short pin is further described below with respects to FIGS. 1-2.

Figure 1:
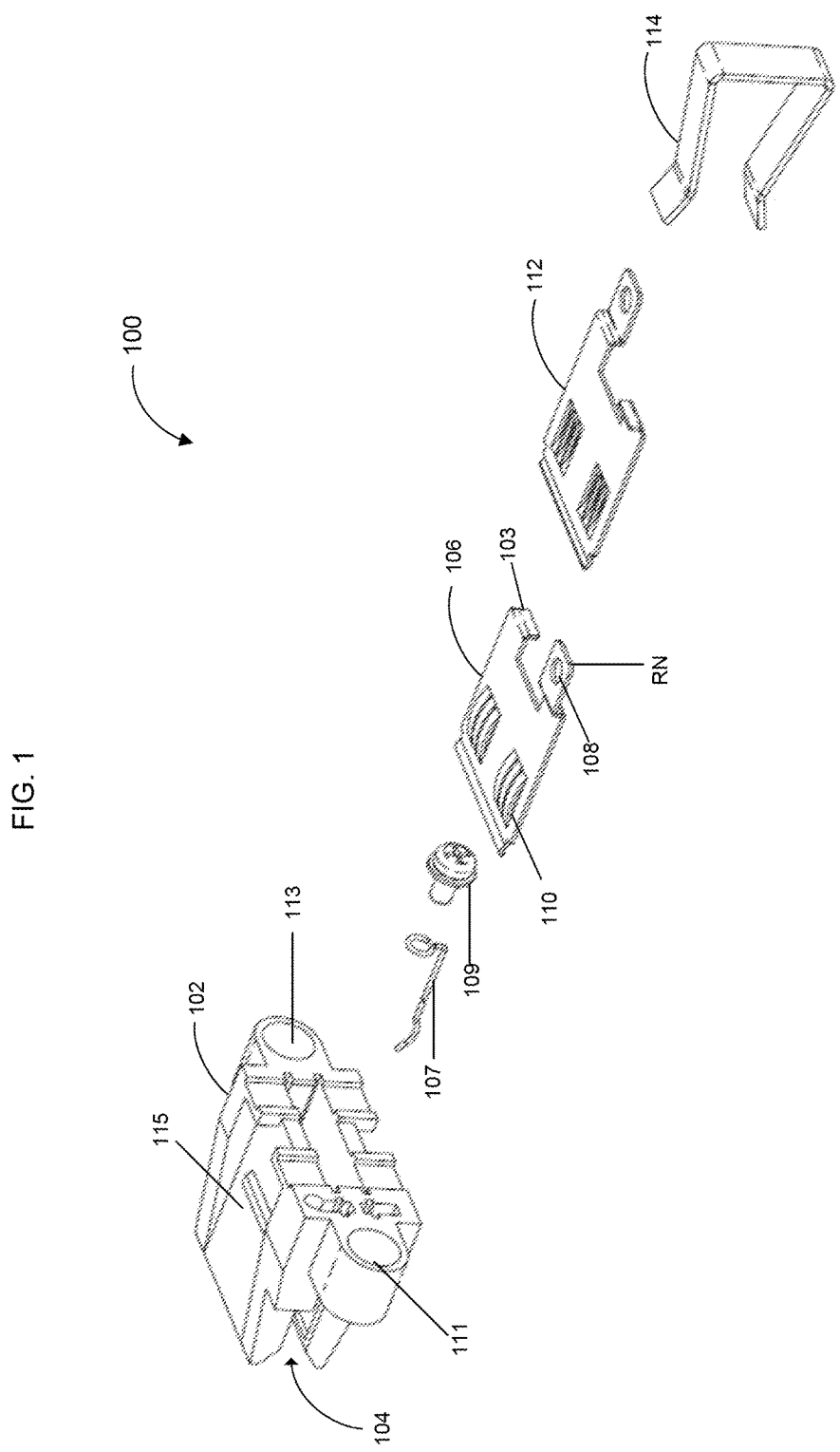
FIG. 1 is an exploded perspective view of an example of a bus bar connector in accordance with aspects of the disclosure.

FIG. 1 is an exploded perspective view of an example of a bus bar connector 100. In this example, the bus bar connector 100 includes a housing 102 for accommodating various parts of the bus bar connector 100. The housing 102 can be a type of synthetic or non-synthetic polymer (e.g., a glass-filled nylon or plastic) that provides stability and a degree of flexibility when force is applied. The housing 102 is configured to receive a bus bar (not shown), such as a laminated bus bar comprised of two strips of an electrically conductive material (e.g., copper) with an insulator between them where power can be carried on one of the strips and a return path (e.g., ground) on the other. In some embodiments, the bus bar can also be a multi-layer bus bar, for example, a bus bar with 2 layers where one layer is for power and the other is for a return path. The bus bar provides an electrical power source to a plurality of electrical components attached to the bus bar connector 100.

As shown in FIG. 1, the bus bar housing 102 includes a slot 104. The slot 104 extends along a longitudinal axis of the housing 102. When the housing is mated with the bus bar, the slot 104 is arranged to be parallel to a longitudinal axis of the bus bar (not shown). In some aspects, the slot 104 may be adapted to allow the bus bar to pass through the housing 102. For example, upon receiving a bus bar at slot 104, the housing 104 can be moved along the bus bar by passing the bus bar through the slot 104 along the longitudinal axis of the housing 102.

In one aspect, the bus bar connector 100 may include one or more panel-mounting features, such as mounting brackets 111 and 113, which can be configured at each side of the housing 102. Once positioned along the bus bar, the panel mounting features allow the housing 102 to be secured, for example, to a sheet metal chassis or other material used for housing the bus bar. Each mounting bracket can be adapted to receive a threaded or non-threaded mounting lug (not shown), which can be screwed or otherwise inserted into that mounting bracket for securing the housing 102 to the chassis. Although the panel-mounting features (e.g., mounting brackets 111 and 113) are illustrated in FIG. 1 at opposite sides of the housing 102, these features may be configured at different positions on the housing 102 as necessary for securing the housing 102 in place.

The bus bar connector 100 is configured to make electrical contact with the bus bar. For example, as shown in FIG. 1, the bus bar connector 100 also includes a first electrical contact plate 106 capable of conducting electricity. The first electrical contact plate 106 includes a ring terminal 108 configured on a rear tab portion ("RN") of the plate 106. This terminal 108 may be adapted to receive a type of fastener (not shown) that holds an electrical component, such as a printed circuit board (PCB), server, computing device or other types of devices requiring an electrical current, onto the plate 106. In some aspects, the ring terminal 100 can feed power to the connected electrical component that returns through the bus bar connector 100.

In order to make electrical contact with the bus bar, the bus bar connector 100 also includes a second electrical contact plate 112 similar to the first electrical contact plate 106. For example, the second electrical contact plate 112 also includes a ring terminal configured on a rear tab portion RN of the plate 112. The second electrical contact plate 112 differs in that it is oriented opposite to corresponding portions of the first electrical contact plate 106.

In some aspects, the ring terminals of the electrical contact plates can be adapted to receive a ring lug or another type of device capable of accepting wiring. In this way, the bus bar connector 100 can adapt from being a board-mounted connector, such as a connector for matting a PCB onto a bus bar, to a cable-mounted connector.

Each electrical contact plate 106 and 112 can include contact fingers or ridges. As shown in the example of FIG. 1, the first electrical contact plate 106 includes a number of contact fingers 110 arranged on a surface of the plate 106 that may be facing the bus bar. An advantage of the contact fingers 110 is that they increase gripping strength of the contact plate when held against the bus bar. This process of engaging contact plates for gripping a bus bar is further described below.

To facilitate mating of the bus bar connector 100 with a bus bar, the electrical contact plates of the connector are inserted into the slot 104 and configured opposite to each other. For example, the first electrical contact plate 106 may be inserted into slot 104 below the second electrical contact plate 112. In some aspects, the first and second electrical contact plates 106 and 112 may include a stopper device to ensure the contact plates as inserted correctly. In this regard, the stopper device can include a stopper 103 (e.g., a tab) that may indicate when a particular contact plate has been fully inserted into the housing 102. For example, upon insertion of the electrical contact plates 106 and 112 into housing 102, the stopper device may engage a part of the housing 102 indicating that the contact plates are fully inserted. Having the contact plates fully inserted into the housing 102 ensures a maximum level of electrical contact with the bus bar when the bus bar connector 100 is mated with the bus bar.

The first and second electrical contact plates 106 and 112 can be held against or otherwise grip opposite sides of a bus bar passing between the plates through slot 104. For example, a means of applying an amount of contact force to the housing 102 can be employed to bring the two respective contact plates into electrical contact with the bus bar, thereby making a full electrical circuit between the bus bar and an electrical component attached to the bus bar connector 100.

For applying a desired amount of clamping force (e.g., approximate 25 lbs) to the housing 102 for gripping the bus bar, the bus bar connector 100 may also include a spring clip 114. For example, the housing 102 may be configured to allow insertion and removal of the spring clip 114. In some aspects, the spring clip 114 may be received at respective connector groves positioned on the housing 102. As shown in FIG. 1, for example, the housing 102 may include a groove 115 for receiving the spring clip 114 configured on outer surfaces thereof, e.g., on respective upper and lower outer surface of the housing 102.

The spring clip 114 may be a material such as a lightweight metal or another type of resilient material that can be repetitively flexed and returns to an original position after manipulation. In addition to providing an amount of clamping force, an advantage of the spring clip is that it may used to prevent creeping (e.g., a tendency of a solid material to move slowly or deform over time) of the housing 102 on the bus bar.

The bus bar connector 100 may also include a short pin detector incorporated into bus bar connector 100. For example, the short pin detector may include a short pin 107, a fastener 109, such as a ring lug, to secure the short pin 107 to the housing 102 and circuitry (not shown) for generating one or more signals. The housing 102 of bus bar connector 100 is configured to receive the short pin 107 and fastener 109. For example, the short pin 107 can be inserted into the housing 102 in order to connect with the bus bar passing through slot 104 between the first and second electrical contact plates 106 and 112. In some aspects, the short pin may be configured to engage one or more of the contact plates as well as the bus bar.

The short pin 107 may be a type of phosphorus bond or other types of alloy spring materials that are capable of carrying an electrical signal. In some aspects, the short pin can be covered with a plating (e.g., nickel) to help avoid galvanic corrosion. Circuitry of the short pin detector is electrically conductive to generate and transmit a signal. For example, the short pin detector includes a type of a gate or digital logic circuit that is designed to generate one or more voltage signals, such as a logical 1 indicating that the short pin 107 has engaged the bus bar and a logical 0 indicating that the short pin 107 has disengaged the bus bar. In this regard, the signal may indicate that the connector is fully mated to a power source so that current can flow through the housing 102 to an attached electrical component.

When the short pin 107 subsequently disconnects from the bus bar, circuitry of the short pin detector can send another signal that indicates the power source may be terminating. In some aspects, the short pin detector may also include other components for generating and transmitting such signals. Using a short pin detector in this manner allows for safe connection and removal of the bus bar connector 100 to and from a bus bar. For example, this process can prevent electrical arcing (e.g., discharge of a current that can form when a strong current jumps a gap in a circuit such as between two electrodes), which can possibly damage an attached electrical component or injure a person.

Figure 2:
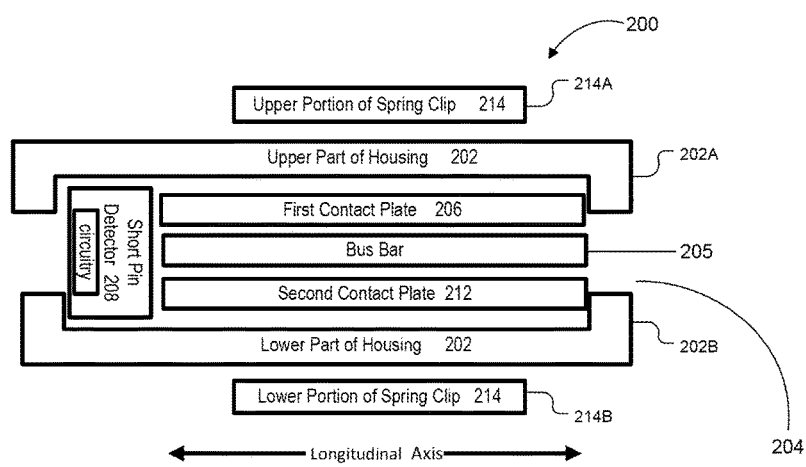
FIG. 2 is a cross sectional diagram of an assembled bus bar connector in accordance with aspects of the disclosure.

In FIG. 2, a cross sectional diagram of an assembled bus bar connector 200 is shown. Although in this example a particular contact plate is illustrated as being placed on top of the other, the contact plates may be configured in various orientations, for example, by rotating a longitudinal axis of the bus bar connector 200. In this way, the contact plates may be configured vertically or horizontally with respect to an orientation of a longitudinal axis of a bus bar passing through the bus bar connector 200 between the plates.

As shown in FIG. 2, bus bar 205 is disposed between a first contact plate 206 and a second contact plate 212 inside of a slot 204 of the bus bar connector 200. As discussed above, an amount of contact force can be applied in order for the assembled bus bar connector 200 to connect to the bus bar 205. For example, spring clip 214 has an upper and lower portion 214A and 214B configured so that the upper portion 214A rests on an upper part of the housing 202A while the lower portion 214B rests on lower part of the housing 202B, opposite of 202A. In some aspects, the spring clip 214 can adjust from a first position (e.g., an original position) to a second position (e.g., the upper and lower portions 214A and 214B bending outwards in opposite directions) which allows the clip 214 to be placed over the housing 202. As the spring clip 214 reforms back to the first position, force is applied to respective parts of the housings 202, thereby holding the first and second contact plates 206 and 212 against the bus bar 205.

To connect bus bar connector 200 to the bus bar 205, cascading levels of engagement may be employed. For example, after engaging the first and second electrical contact plates 206 and 212 of the bus bar connector 200 with a bus bar, a short pin detector 208 may detect that a short pin (not shown) has made contact with the bus bar. In this regard, the short pin detector 208 may sense when the short pin connects with the bus bar and may send a signal in response. For example, when the short pin connects with the bus bar, the short pin detector 208 sends a signal to an attached electrical component. In one aspect, the signal indicates that the attached electrical component can safely activate. Alternatively, the short pin associated with the short pin detector 208 may be configured to engage the return side of the bus bar connector 200 (e.g., one of the contact plates) before the short pin detector 208 transmits a type of an activation signal indicating that the bus connector 200 is fully attached to a bus bar.

To disengage the bus bar connector 200 from the bus bar 205, the cascading levels of engagement described above may be employed in reverse order. For example, in extracting the bus bar connector 200 from the bus bar, the short pin may be disengaged from the bus bar before the first and second electrical contact plates 206 and 212. After a gap of a few milliseconds, the first and second electrical contact plates 206 and 212 may also disengage from the bus bar. When the short pin loses contact to the bus bar, the short pin detector 208 may transmit another signal to the attached component. In response, the component may immediately shut down or otherwise turn off before the contact plates are disengaged from the bus bar.

FIG. 3 is a flow diagram 300 of a system operation being done at/by an apparatus 302 (e.g., distribution board), which is attached to a device 304, such as a PCB. At stage 310, a bus bar connector that includes first and second electrical contacts and a short pin detector may be received. For example, the bus bar connector may be received at a distribution board, which may house a bus bar. In some aspects, the short pin detector may include a short pin, a fastener means, such as ring lug, which may be used to secure the short pin to the bus bar connector and circuitry for generating one or more signals.

At stage 320, the first and second electrical contacts engage the bus bar. For example, the first and second electrical contact plates may be brought into electrical contact with the bus bar by passing the bus bar between the two plates. In this regard, a means of applying an amount of contact force to the bus bar connector, such as a spring clip, can be used to hold each respective plate firmly against the bus bar.

At stage 330, the short pin detector may detect that the short pin has been connected to the bus bar. After engaging the first and second electrical contacts with the bus bar in stage 320, a short period of time may pass then the short pin may be connected to the bus bar. For example, the bus bar connector can be configured to receive the short pin associated with the short pin detector. In this regard, the short pin can be inserted into the bus bar connector in order to connect with a bus bar passing between the first and second electrical contact plates.

At stage 340, a signal is transmitted indicating that the bus bar connector is fully connected to the bus bar. For example, the circuitry of the short pin detector can be configured to transmit one or more signals in which at least one of the signals (e.g., a voltage signal equivalent to a logical 1) may indicate that the short pin has made contact with the bus bar. This may indicate that the bus bar connector has fully mated with the bus bar.

At stage 350, the signal may be received at an attached electrical component. For example, this electrical component may be configured to receive the signal transmitted at stage 340.

At stage 360, in response to receiving the signal, circuitry of the attached electrical component is activated. For example, the circuitry may include hot-swap circuitry that may automatically activate upon receiving the signal. In that regard, after transmitting the first signal, a flow of electrical current from the bus bar through the bus bar connector is initiated.

FIG. 4 is an example of another flow diagram 400, which describes a technique for disengaging a bus bar connector with an integrated short pin detector, such as the bus bar connector 100 described above with respect to FIG. 1, from a bus bar housed within apparatus 302. At stage 410, the short pin detector detects that a short pin has been disengaged from a bus bar. For example, the short pin associated with the short pin detector may be disconnected from the bus bar. In this regard, the short pin disconnects before the first and second electrical contact plates of the bus bar connector disengage. For example, after a few milliseconds, the first and second electrical contact plates may also disengage from the bus bar.

At stage 420, a signal may be transmitted indicating that the bus bar connector is being disconnected from the bus bar. For example, when the short pin associated with the short pin detector losses contact to the bus bar, the short pin detector sends a signal (e.g., a voltage signal equivalent to a logical 0) to the attached component indicating that the bus bar connector is disengaging from the bus bar.

At stage 430, the signal is received. For example, a device, such as attached electrical component 304, receives the signal transmitted at stage 420 that indicates the bus bar connector is disengaging from the bus bar.

At stage 440, in response to receiving the signal, circuitry of the attached electrical component is deactivated. For example, upon receiving the signal, device 304 may immediately shut down or otherwise turn off before the contact plates are disengaged from the bus bar, which in turn will terminate the flow of current through the bus bar connector.

As these and other variations and combinations of the features discussed above can be utilized without departing from the disclosure as defined by the claims, the foregoing description of the embodiments should be taken by way of illustration rather than by way of limitation of the disclosure as defined by the claims. It will also be understood that the provision of examples of the disclosure (as well as clauses phrased as "such as," "e.g.", "including" and the like) should not be interpreted as limiting the disclosure to the specific examples; rather, the examples are intended to illustrate only some of many possible embodiments.

The invention claimed is:

1. A method, comprising:
  receiving a bus bar connector, the bus bar connector comprising:
    a housing having first and second electrical contacts, the first and second electrical contacts being configured to connect to a bus bar, and
    a short pin detector attached to the housing, the short pin detector being configured to transmit one or more signals;
  engaging the first and second electrical contacts with the bus bar; and
  in response to engaging the first and second electrical contacts, transmitting, by the short pin detector, a first signal indicating that the housing is connected to the bus bar and activating hot-swap circuitry of an electrical component associated with the bus bar connector.

2. The method of claim 1, wherein the short pin detector includes circuitry configured to generate the one or more signals.

3. The method of claim 2, further comprising:
  disengaging the short pin from the bus bar; and
  transmitting a second signal indicating that the housing is being disconnected from the bus bar.

4. The method of claim 3, further comprising:
  receiving the second signal at the electrical component, the electrical component being attached to the housing; and
  in response to receiving the second signal, deactivating the hot-swap circuitry of the electrical component.

5. The method of claim 1, wherein the short pin detector includes a short pin and a fastener to secure the short pin to the housing.

6. The method of claim 5, wherein transmitting includes connecting the short pin to the bus bar after engaging the first and second electrical contacts.

7. The method of claim 1, further comprising:
  receiving the first signal at the electrical component, the electrical component being attached to the housing; and
  wherein activating the hot-swap circuitry is in response to receiving the first signal.

8. The method of claim 7, further comprising initiating a flow of electrical current from the bus bar through the housing after transmitting the first signal.

9. A system, comprising:
  a bus bar for supplying current from a power supply to a device; and
  a bus bar connector, the bus bar connector comprising:
    a housing having first and second electrical contacts, the first and second electrical contacts being configured to connect to the bus bar, and
    a short pin detector attached to the housing, the short pin detector being configured to transmit one or more signals, wherein at least one of the one or more signals indicates that the housing is connected to the bus bar.

10. The system of claim 9, wherein the short pin detector includes circuitry configured to generate the one or more signals.

11. The system of claim 9, wherein the short pin detector includes a short pin and a fastener to secure the short pin to the housing.

12. The system of claim 11, wherein to transmit the one or more signals includes engaging the short pin onto the bus bar.

13. The system of claim 9, wherein the device is configured to activate circuitry of an electrical device coupled to the bus bar connector in response to receiving the first signal.

14. The system of claim 13, wherein the bus bar connector is configured to initiate a flow of electrical current from the bus bar through the housing after transmitting the first signal.

15. The system of claim 9, wherein the short pin detector is configured to transmit a second signal indicating that the housing is being disconnected from the bus bar.

16. The system of claim 15, wherein the device is configured to deactivate circuitry of an electrical device coupled to the bus bar connector in response to receiving the second signal.

17. An apparatus, comprising:
  a housing having first and second electrical contacts, the first and second electrical contacts being configured to connect to a bus bar, and
  a short pin detector attached to the housing, the short pin detector being configured to transmit one or more signals, wherein at least one of the one or more signals indicates that the housing is connected to the bus bar.

18. The apparatus of claim 17, wherein the short pin detector includes circuitry configured to generate the one or more signals.

19. The apparatus of claim 17, wherein the short pin detector includes a short pin and a fastener to secure the short pin to the housing.

20. The apparatus of claim 17, wherein the short pin detector is configured to transmit a second signal indicating that the housing is being disconnected from the bus bar.

* * * * *